United States Patent [19]

Feuerstein et al.

[11] Patent Number: 5,070,811

[45] Date of Patent: Dec. 10, 1991

[54] APPARATUS FOR APPLYING DIELECTRIC OR METALLIC MATERIALS

[76] Inventors: Albert Feuerstein, Ringstrasse 12, D-6451 Neuberg 2; Rainer Ludwig, Uhlandstrasse 3, D-8757 Karlstein-Dettingen, both of Fed. Rep. of Germany

[21] Appl. No.: 271,175

[22] Filed: Nov. 14, 1988

[30] Foreign Application Priority Data

Sep. 27, 1988 [DE] Fed. Rep. of Germany ....... 3832693

[51] Int. Cl.$^5$ ........................................... C23C 16/50
[52] U.S. Cl. .................................. 118/623; 118/718; 118/723; 118/726; 118/727; 427/38; 427/47; 427/50
[58] Field of Search ............... 118/621, 623, 718, 723, 118/726, 727; 427/38, 47, 50, 248.1; 204/192.11, 192.12, 192.31, 298.04, 298.05, 298.16, 298.17, 298.36

[56] References Cited

U.S. PATENT DOCUMENTS

| | | | |
|---|---|---|---|
| 3,898,952 | 8/1975 | Shirahata et al. | 118/723 |
| 3,916,034 | 10/1975 | Tsuchimoto | 427/38 |
| 3,935,412 | 1/1976 | McDonough et al. | 219/10.491 |
| 4,016,389 | 4/1977 | White | 219/10.491 |
| 4,197,175 | 4/1980 | Moll et al. | 427/38 |
| 4,254,159 | 3/1981 | Pulker et al. | 427/38 |
| 4,301,391 | 11/1981 | Seliger et al. | 315/111.31 |
| 4,339,691 | 7/1982 | Morimiya et al. | 315/111.21 |
| 4,362,767 | 12/1982 | Nouchi et al. | 118/726 |
| 4,683,838 | 8/1987 | Kimura et al. | 118/723 |
| 4,739,170 | 4/1988 | Varga | 250/427 |
| 4,805,555 | 2/1989 | Itoh | 118/723 |
| 4,812,326 | 3/1989 | Tsukazaki et al. | 204/298.05 |
| 4,885,070 | 12/1989 | Campbell et al. | 204/192.11 |

FOREIGN PATENT DOCUMENTS

| | | |
|---|---|---|
| 0035894 | 9/1981 | European Pat. Off. . |
| 0095384 | 11/1983 | European Pat. Off. . |
| 0134399 | 3/1985 | European Pat. Off. . |
| 0278494 | 8/1988 | European Pat. Off. . |
| 60-183719 | 9/1985 | Japan ............... 118/726 |
| 1187126 | 8/1986 | Japan ............... 118/726 |
| 2118517 | 5/1987 | Japan ............... 118/727 |
| 2130279 | 6/1987 | Japan ............... 118/723 |
| 3026351 | 2/1988 | Japan ............... 118/727 |
| 3203767 | 8/1988 | Japan ............... 204/298.05 |
| 1154237 | 6/1969 | United Kingdom . |
| 1257015 | 12/1971 | United Kingdom . |
| 2085482 | 4/1982 | United Kingdom . |
| 2204596 | 11/1988 | United Kingdom . |

OTHER PUBLICATIONS

DaSilva, E. M. and P. White, "Fabrication of Aluminum Oxide Films", IBM Technical Disclosure Bulletin, vol. 4, No. 6 (Dec. 1961) p. 6.

Preparation of Si$_3$N$_4$ Coatings, Journal Vac. Sci. Tech., vol. 12, No. 4, pp. 821-825 (1975).

Ion Plating in a System with a Hot Cathode, J. Vac. Sci. Tech. 41(2) Apr. 1983, pp. 241-243.

High-Rate Vapor Deposition and Large Systems, Journal Vac. Sci. Tech. A5(4) Jul.-Aug. 1987, p. 2239.

Plasma Surface Interaction ..., Goebel, Campbell, and Conn, Journal of Nuclear Materials, vol. 121, pp. 277-282 (1984).

Primary Examiner—Shrive Beck
Assistant Examiner—Terry J. Owens

[57] ABSTRACT

In an apparatus for applying dielectric or metallic substances, such as silicon dioxide, for example, to a substrate (15) disposed in a vacuum chamber (16, 17), the apparatus having an electron emitter (9) and having solenoid coils (30, 42) disposed in the area of the vacuum chamber, the electron emitter (9) is disposed in a separate generator chamber (37) forming the anode (11) and communicating with the vacuum chamber (17), so that, after the process gas is introduced into the generator chamber (37) a large-area plasma jet (8) is produced which is guided by the action of magnets (6, 20, 30, 42) between the electron emitter (9) and a melting furnace (7) disposed in the vacuum chamber (17), while the vapor stream issuing from the melting furnace (7) is accelerated and reaches the substrate (15) as activated vapor.

5 Claims, 1 Drawing Sheet

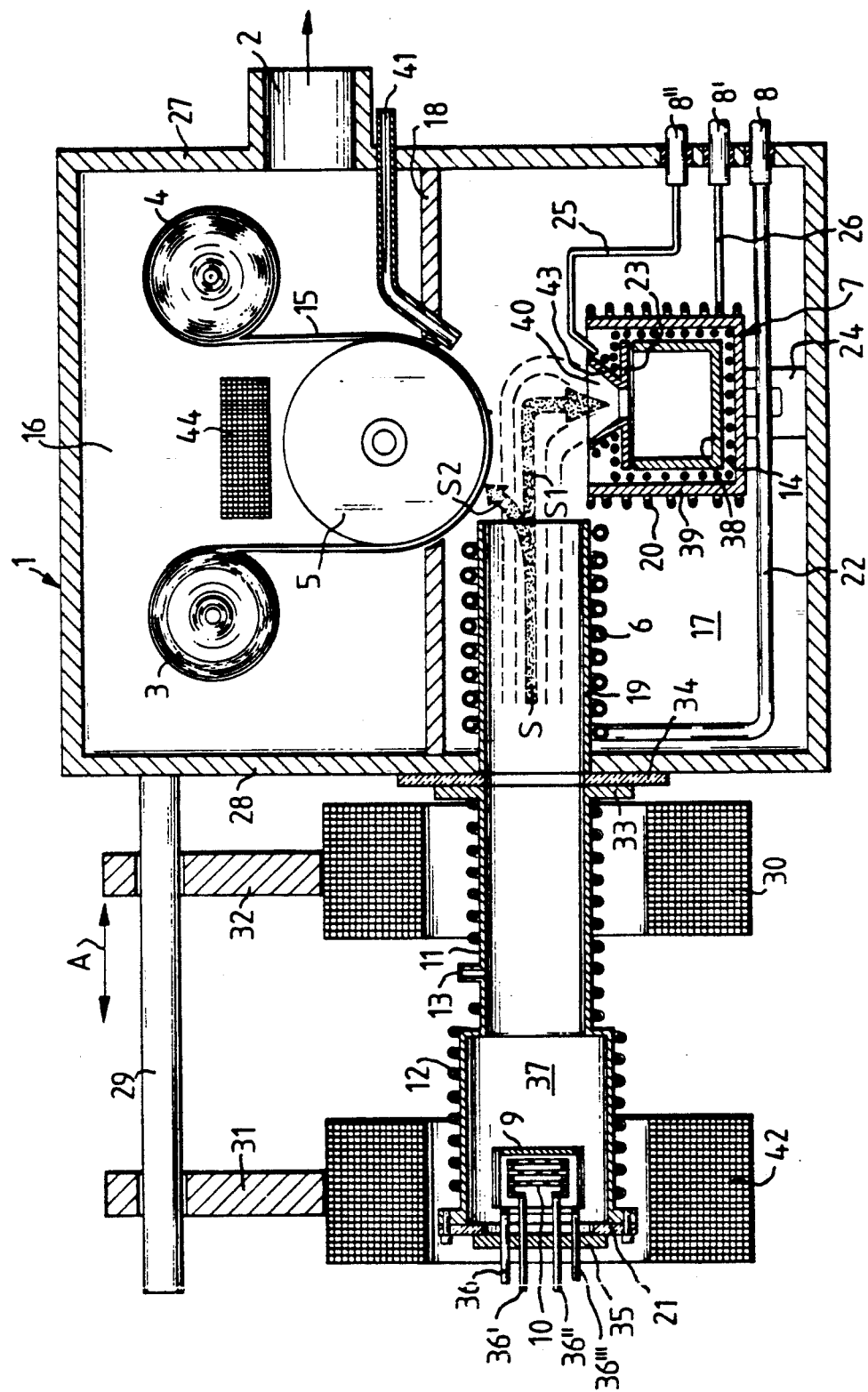

APPARATUS FOR APPLYING DIELECTRIC OR METALLIC MATERIALS

BACKGROUND OF THE INVENTION

1. Field of Invention

The invention relates to an apparatus for applying dielectric or metallic materials, silicon dioxide for example, onto a substrate disposed in a vacuum chamber, having a gas inlet leading into the vacuum chamber, having an electron emitter, and having magnets disposed in the area of the vacuum chambers; more particularly, apparatus in which the electron emitter is disposed in a separate generator chamber which is in communication with the vacuum chamber where the generator chamber forms the anode and has an inlet for the process gas.

2. Discussion of Related Art

It is known that, at a certain vaporization rate, quartz vapor decomposes to SiO and O. The coatings obtained by the simple thermal vaporization of quartz usually have an oxygen deficit, so that an oxygen atmosphere is usually maintained during the coating (by the addition of outside oxygen).

An increase of the rate of deposition of stoichiometric $SiO_2$ coatings can be achieved by activating the $SiO_2$ vapor by plasma excitation. A variety of reactive vapor deposition methods are known, which operate with an additional plasma excitation, e.g., the ARE (activated reactive deposition) method in which plasma excitation is achieved in electron beam vaporization by means of an additional electrode; furthermore, methods are known which operate by highfrequency plasma excitation.

Furthermore, a plasma generator with an ion beam generator is known (article by D. M. Goebel, G. A. Campbell and R. W. Conn in JOURNAL OF NUCLEAR MATERIAL 121 (1984), 277-282, North Holland Physics Publishing Division, Amsterdam). The generator is disposed in a separate chamber connected to the vacuum chamber, while the approximately cylindrical wall of this separate chamber forms the anode and is provided with an inlet connection for the process gas. The cylindrical chamber is provided with annular solenoids and with tubes for cooling the chamber wall. The electron emitter itself is situated on a portion of the wall closing the one end of the cylindrical chamber facing away from the actual vacuum enclosure.

SUMMARY OF THE INVENTION

It is the purpose of the present invention to create an apparatus for the vapor depositing of materials, especially for quartz ($SiO_2$), which will deposit vapor at a very high rate and can produce stoichiometric, dense quartz coatings on a film, of the kind needed for the packaging industry. Transparent barrier coatings of this kind are needed, for example, for the visible packaging of foods and for packaging transparent to microwaves. Furthermore, the apparatus is to permit the application of scratch-resistant coatings to plates or other substrates.

An electron emitter disposed in a separate generator chamber corresponding to the vacuum chamber and forming the anode produces, after the introduction of the process gas, a large-area plasma jet which is guided, under the action of magnets, between the electron emitter and a melting furnace disposed in the vacuum chamber underneath the substrate. The plasma jet strikes the cloud of vapor issuing from the melting furnace (7), so that the activated vapor reaches the substrate.

Preferably, an inlet connection for a gas, such as oxygen for example, leads into the apparatus between target and substrate, so that the vaporized material reacts with the gas on the substrate surface or before growing on the substrate.

BRIEF DESCRIPTION OF THE DRAWING

The sole figure is a diagrammatic section view of the apparatus with a separate plasma source for coating tapes and films.

DETAILED DESCRIPTION OF A PREFERRED EMBODIMENT

The coating apparatus consists substantially of a vacuum enclosure 1 with pump connection 2, the supply roll 3 and winder 4 rotatably mounted in the vacuum enclosure. The coating cylinder 5 is, likewise, rotatably mounted. The partition wall 18 divides the vacuum enclosure 1 into two chambers 16 and 17. THe tubular connection 19 runs transversely in the vacuum enclosure 1 parallel to the partition wall 18. The tube 22 wound about the tubular connection forms a solenoid 6 and a cooling coil. A melting furnace 7, with resistance heating 14 and solenoid 20, is held on a base support 24 in a position perpendicular to the partition wall 18. The tubular connection 19, and the two cables 25, 26 carrying electric current, like tube 22, are brought sealingly through the one end wall 27 of the vacuum enclosure 1 at 8, 8', etc.

Furthermore, the coating apparatus has a rail 29 fixedly disposed on the other end wall 28 of the vacuum enclosure 1. On this rail the solenoids 30 and 42 with their coil mountings 31 and 32 are held and guided for displacement in the direction of the arrow A. The anode 11 in the form of a tube concentric with the solenoids 42 and 30 is provided, whose longitudinal axis is aligned with the longitudinal axis of the connection 19 in the chamber 17 of the vacuum enclosure 1, and whose end remote from the vacuum enclosure 1 is closed with an insulator 21 which bears an electron emitter 9 with heater 10.

The anode 11 has at its end adjacent the vacuum enclosure 1 a flange 33 by which it is held on the end wall 28 of the vacuum enclosure 1. However, between the flange 33 and the end wall 28 there is an insulator 34 which electrically insulates the tubular anode 11 from the connection 19 and end wall 28. The tubular anode 11 is provided laterally with an inlet connection extending radially outwardly, and is surrounded by a coil 12 of tubing through which cooling water flows. The insulator 21 is affixed to a perforated plate 35 on which the water and electrical lines 36, 36', etc. are provided.

In the interior of the evacuated generator chamber 37 of tubular configuration, electrons are emitted from the electron emitter 9 over on a large area and are accelerated by the anode 11. A plasma is ignited by gas simultaneously admitted into the generator chamber 37 through the connection 13.

By means of the solenoids 6, 30, 20, 42, which surround the generator 37 and the melting crucible 7, and the solenoid 44 disposed above the coating cYlinder 5, the plasma is restricted to a tubular area between the electron emitter 9, the generator chamber 37, the substrate 15 and the melting furnace 7. The magnetic field brings it about that the emitted primary electrons drift along the lines of force and can reach the anode only through collisions, the quartz vapor issuing from the crucible 38 filled with molten quartz being activated by the plasma jet S1. The atoms and molecules thereby activated drift along the magnetic lines of force toward the substrate film 15. Thus, an ion stream of high intensity (up to an A/cm² order of magnitude) is available at the nozzle plate 23 of the melting crucible 38. By varying the magnetic field it is possible to "bend" the plasma jet S1 by as much as 90 degrees. Consequently the installed position of the melting furnace 7 relative to the longitudinal axis of the generator chamber 37 and to the connection 19 and substrate 15 can be chosen within certain limits.

The melting furnace 7 for the vaporizing of quartz is preferably made of graphite. At the desired heating temperatures of 1500° to 200020 C., graphite has the lowest reaction with quartz. The graphite furnace is constructed such that the wetting of the graphite wall by the quartz material in the alternating-temperature mode of operation (heating the furnace up and cooling it down) does not produce any basic damage to the furnace. For this purpose the inner lining of the furnace is of segmented construction. The graphite furnace is heated by a resistance heater 14 or by an induction heater not shown in the drawing. An appropriate radiant-heat insulation 39 serves to minimize the radiation losses. The upper part of the furnace 7 is equipped with a nozzle plate 23 to provide for additional aiming of the vapor stream at the substrate 15. By an appropriate heating system (resistance heating, heating by direct passage of current, or heating by the plasma jet itself), this nozzle plate can be kept at a temperature at which no condensation of the SiO₂ takes place.

The plasma jet S1 is aimed by the magnetic fields of coils 6 and 20 at the funnel-shaped opening 40 or nozzle plate 23 of the furnace 7. An intense interaction thus occurs at the point of greatest vapor density.

By means of an oxygen nozzle 41 for the controlled admission of oxygen into the plasma cloud, the vapor jet can be aimed more toward the vapor cloud, but it can also be aimed more at the substrate 15.

The combination of the three components, namely melting furnace 7, plasma source 9 and the cooled coating cylinder 5, makes it possible to achieve a uniform coating rate over the length of the coating cylinder 5. For that purpose the furnace 7 for the vaporization of the quartz must be kept at a very uniform temperature, which can be achieved by the appropriate dimensioning of the heater 14. Independently of the thermal vaporization, the plasma source 9 provides the excitation of the SiO₂ vapor necessary for a high-quality coating.

The described plasma source 9 has the advantage that it produces a plasma of very high electron density, which is advantageous for the activation of the vapor, while the plasma jet S is guided by appropriate magnetic fields.

By combining a classical thermal vaporizer with separate plasma excitation, the deposition rate and the degree of ionization can thus be adjusted independently, resulting in great flexibility in the production of the desired coating structures and coating stoichiometries.

We claim:

1. Apparatus for vapor deposition of a material onto a substrate, comprising
   a vacuum chamber;
   a melting furnace in said vacuum chamber, said melting furnace vaporizing said material, said furnace comprising a crucible, a heating coil at least partly surrounding said crucible, a nozzle plate with an opening on top of said crucible, and a funnel-like collar surrounding said opening;
   a generator chamber communicating with said vacuum chamber, said generator chamber having therein an electron emitter and an inlet for process gas between said emitter and said vacuum chamber;
   magnetic field producing means for accelerating said electrons from said emitter toward said vacuum chamber, thereby producing a plasma at said process gas inlet, said plasma in turn being accelerated as a plasma jet toward said vacuum chamber;
   magnetic field producing means comprising a solenoid coil surrounding said furnace and said nozzle plate for aiming at least part of said plasma jet at said funnel-like collar, thereby activating material vapor issuing from said furnace, whereby,
   a substrate located above said furnace will be exposed to said activated vapor.

2. Apparatus as in claim 1 further comprising a gas inlet leading into the vacuum chamber between the melting furnace and the substrate, whereby the vaporized material can react with a gas admitted by said inlet before being deposited on said substrate.

3. Apparatus as in claim 1 further comprising a heat shield between said heating coil and said solenoid coil.

4. Apparatus as in claim 1 wherein said crucible, said nozzle plate, and said funnel-like collar are made of graphite.

5. Apparatus as in claim 1 wherein said solenoid coil surrounds said funnel-like collar.

* * * * *

UNITED STATES PATENT AND TRADEMARK OFFICE
CERTIFICATE OF CORRECTION

PATENT NO.  : 5,070,811
DATED       : December 10, 1991
INVENTOR(S) : Albert Feuerstein et al.

It is certified that error appears in the above-indentified patent and that said Letters Patent is hereby corrected as shown below:

On title page, item [73] Assignee: insert --Leybold Aktiengesellschaft, Hanau 1, Germany--.
On title page,
 Under "Assistant Examiner - Terry J. Owens" insert
   --Attorney, Agent, or Firm - Felfe & Lynch--.

Abstract, line 10, delete "plasma jet (8)" and insert
   --plasma jet (S)--.

Col. 1, lines 12-13, delete "; more particularly, apparatus in
   which" and insert --.  More particularly, one in which--.

Col. 2, line 64, delete "cYlinder 5" and insert
   --cylinder 5--.

Col. 3, line 18, delete "200020C" and insert --2000°C--.

Signed and Sealed this

Twenty-sixth Day of October, 1993

Attest:

BRUCE LEHMAN

*Attesting Officer*        *Commissioner of Patents and Trademarks*